(12) United States Patent
Bhattacharyya et al.

(10) Patent No.: US 6,344,373 B1
(45) Date of Patent: Feb. 5, 2002

(54) ANTIFUSE STRUCTURE AND PROCESS

(75) Inventors: Arup Bhattacharyya, Essex Junction; Robert M. Geffken, Burlington; Chung H. Lam, Williston; Robert K. Leidy, Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/106,980

(22) Filed: Jun. 29, 1998

Related U.S. Application Data (62) Division of application No. 08/850,033, filed on May 2, 1997, now Pat. No. 5,811,870.

(51) Int. Cl.$^7$ ................................................ H01L 21/82
(52) U.S. Cl. ................. 438/131; 438/467; 438/787; 438/791; 438/381
(58) Field of Search ...................... 438/131, 467, 438/130, 483, 787, 791, 381

(56) References Cited

U.S. PATENT DOCUMENTS

| | | | |
|---|---|---|---|
| 4,870,470 A | 9/1989 | Bass, Jr. et al. | 357/23.5 |
| 5,070,384 A | 12/1991 | McCollum et al. | 357/51 |
| 5,095,228 A | 3/1992 | Galbraith et al. | 307/443 |
| 5,166,557 A | 11/1992 | Chen et al. | 307/468 |
| 5,257,222 A | 10/1993 | Lee | 257/530 |
| 5,258,643 A | 11/1993 | Cohen | 257/530 |
| 5,270,251 A | 12/1993 | Cohen | 437/173 |
| 5,272,666 A | * 12/1993 | Tsang et al. | 365/96 |
| 5,304,508 A | 4/1994 | Cohen | 437/170 |
| 5,311,039 A | 5/1994 | Kimura et al. | 257/50 |
| 5,384,481 A | 1/1995 | Holzworth et al. | 257/530 |
| 5,486,707 A | 1/1996 | Look et al. | 257/52 |
| 5,493,144 A | 2/1996 | Bryant et al. | 257/529 |
| 5,493,147 A | 2/1996 | Holzworth et al. | 257/530 |
| 5,502,000 A | 3/1996 | Look et al. | 437/60 |

OTHER PUBLICATIONS

A. Bhattacharyya, et al; Physical and Electrical Characteristics of LPCVD Silicon Rich Nitride, The Electrochemical Society, Vol. 84–2, Oct. 11, 1984 for SRN Processes.

D.J. Dimaria, et al.; A study of the electrical and luminescence characteristics of a novel Si–based thin film electroluminescent device, J. Appl. Phys.54(8) Aug., 1983 for SRO processes.

D.J. Dimaria and D.W. Dong, High Current Injection into $SiO_2$ from silicon $SiO_2$ and Experimental Applications, J. Appl. Phys. 51(5) May, 1980.

* cited by examiner

Primary Examiner—Carl Whitehead, Jr.
Assistant Examiner—Toniae M. Thomas
(74) Attorney, Agent, or Firm—Schmeiser, Olsen & Watts (57) ABSTRACT

According to the preferred embodiment, an antifuse structure and method for personalizing a semiconductor device is provided that overcomes the limitations of the prior art. The preferred embodiment antifuse comprises a two layer transformable insulator core between two electrodes. The transformable core is normally non-conductive but can be transformed into a conductive material by supplying a sufficient voltage across the electrodes. The two layer core preferably comprises an injector layer and a dielectric layer. The injector layer preferably comprises a two phase material such as silicon rich nitride or silicon rich oxide. Initially, the injector layer and dielectric layer are non-conductive. When a sufficient voltage is applied the core fuses together and becomes conductive.

26 Claims, 7 Drawing Sheets

ANTIFUSE STRUCTURE AND PROCESS

RELATED APPLICATION

This application is a divisional of the earlier patent application by Bhattacharyya et al. entitled "ANTIFUSE STRUCTURE", Ser. No. 08/850,033, filed May 2, 1997, now U.S. Pat. No. 5,811,870, which application is incorporated herein by reference.

BACKGROUND OF THE INVENTION

1. Technical Field

This invention generally relates to semiconductor circuit fabrication, and more specifically relates to antifuses in semiconductor devices.

2. Background Art

The proliferation of electronics in our modern world is in large part due to integrated circuit semiconductor devices. Integrated semiconductor devices are designed and used for widely differing applications. For this reason it is often beneficial to have the ability to "personalize" a semiconductor device during fabrication. Personalization of a integrated devices involves changing the integrated device to meet specific circuit needs. For example, changing the input and output structure of a device to allow it to be used in multiple applications.

Often, it is not cost effective to create separate fabrication lines, with different masks and such, for each small change in the device for associated circuit requirements. For this reason, specific techniques are used to personalize the device, i.e., to make specific changes in the device to meet a particular need. Some techniques use fuses to customize a device for a particular need. To personalize such a device, some of the available fuses are blown by a laser or other means to make the desired changes to the device and associated circuits.

Unfortunately, the use of fuse links for device personalization has inherent limitations. Specifically, the fuse link can only be blown open or left closed, they cannot be used to make a previously open link closed. Personalization where a previously open connection is made closed requires the use of an "antifuse." Antifuses are structures that, when first fabricated, are an open circuit. When the antifuse is "fused," the open circuit becomes closed and conduction across the antifuse becomes possible. Thus, antifuses are used to perform the opposite function of a fuse.

Typically an antifuse is fused by applying a sufficient voltage, called a "fusing voltage" across the antifuse structure. This voltage causes a current to flow and the structure to fuse together, resuling in a permanent electrical connection.

The prior art antifuse technology has several disadvantages. For example, many prior art antifuses require specific metal types be used as electrodes. These metals are not always compatible with common fabrication technologies. For example, some prior art devices require a transparent electrode and thus cannot use electrodes consisting of aluminum or polysilicon which are opaque. Furthermore, these antifuse structures generally require 12–15 volts to fuse the antifuse. Applying such a voltage to the antifuse can cause damage to other circuit elements, and thus these antifuses may be incompatible with low-voltage semiconductor devices that commonly operate at 3.3 volts or 2.5 volts. Additionally, these structures will be difficult to scale to the significantly smaller sizes that will be required as semiconductor device density increases.

Therefore, there existed a need to provide an improved structure and method for semiconductor device personalization. Specifically a need existed for an improved antifuse structure and method that can be fused with a lower fusing voltage, can be scaled to smaller device sizes, and can operate with a wide variety of electrodes.

DISCLOSURE OF INVENTION

According to the present invention, an antifuse structure and method for personalizing a semiconductor device is provided that overcomes the limitations of the prior art. The preferred embodiment antifuse comprises a two layer transformable insulator core between two electrodes. The transformable core is normally non-conductive but can be transformed into a conductive material by supplying a sufficient voltage across the electrodes. The two layer core preferably comprises an injector layer and a dielectric layer. The injector layer preferably comprises a two phase material such as silicon rich nitride (SRN) or silicon rich oxide. Initially, the injector layer and dielectric layer are non-conductive. When a sufficient fusing voltage is applied, the core fuses together and becomes conductive.

The present invention has the advantage of being adaptable to a wide variety of uses. In particular, the electrodes can comprise any suitably conductive material (i.e., tungsten, titanium, polysilicon, aluminum, doped silicon). The ability to use any conductive material allows the preferred embodiment antifuse to be used in a wide variety of devices for a wide variety of applications.

Furthermore, the preferred embodiment is highly scalable. The preferred embodiment can be scaled to smaller dimensions and lower operating and fusing voltages. This will allow it to be used in future low voltage technologies.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment of the present invention provides an improved method for device personalization. In particular, an improved antifuse structure and method is provided. Antifuses are devices that perform the opposite function of a fuse. When a sufficient voltage is applied across an antifuse structure the structure becomes permanently shorted, and an electrical connection is made. Antifuses are used in a wide variety of applications, including Field Programmable Gate Arrays (FPGAs).

Figure 1:
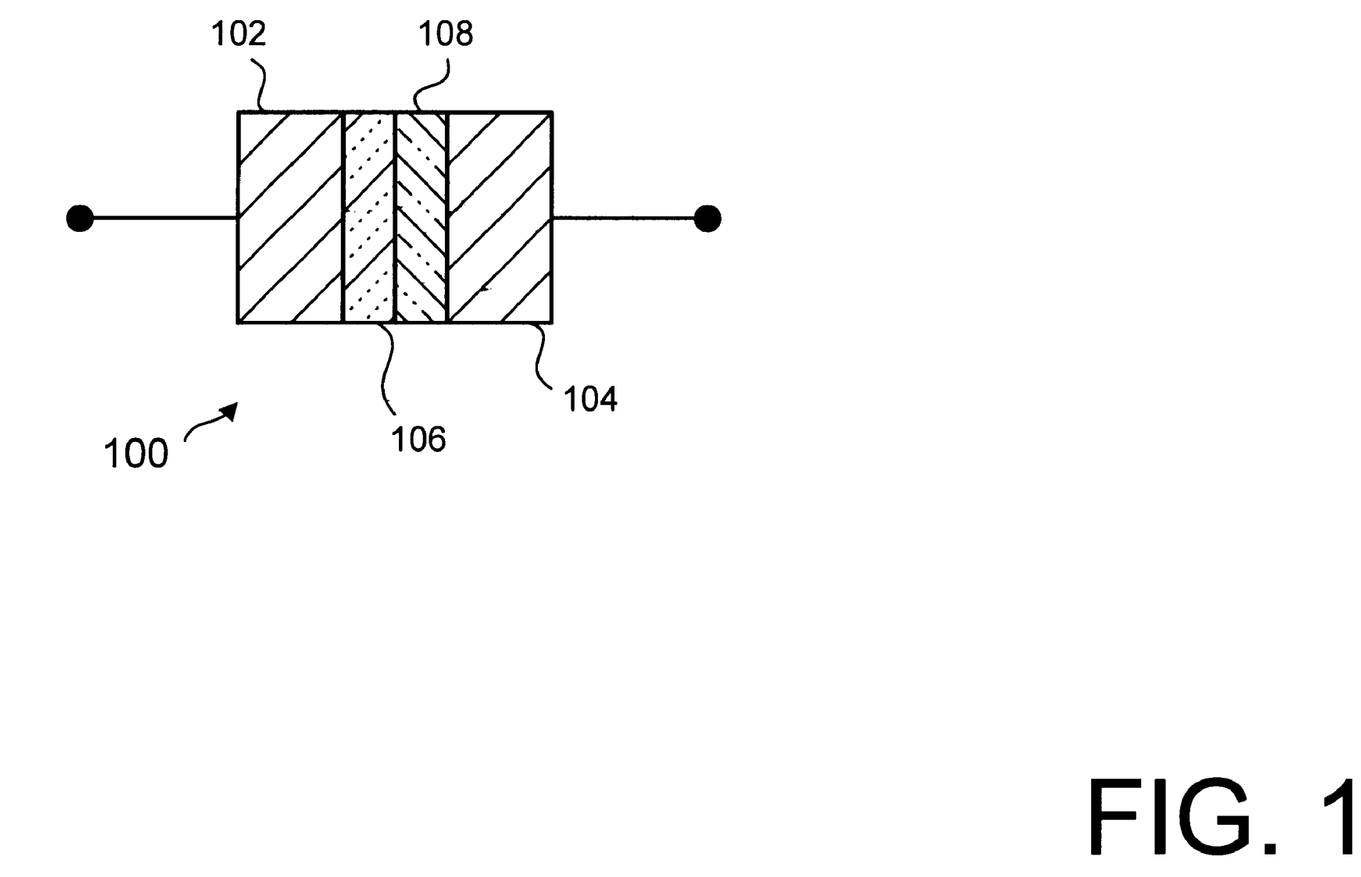
FIG. 1 is a cross-sectional side view of an antifuse structure in accordance with the preferred embodiment.

The preferred embodiment of the present invention uses a two layer core between electrodes as an antifuse structure. Turning to FIG. 1, an antifuse 100 in accordance with the preferred embodiment is illustrated schematically. The antifuse 100 comprises two electrodes 102 and 104 separated by an injector layer 106 and a dielectric layer 108. The electrodes 102 and 104 can comprise any suitably conductive material (i.e., tungsten, titanium, polysilicon, aluminum, doped silicon). The ability to use any conductive material allows the antifuse 100 to be used in a wide variety of devices for many different applications.

The injector layer 106 and the dielectric layer 108 comprise a two layer core that functions as a "transformable insulator," meaning the core is normally a non-conductive material but can be transformed into a conductive material such that the two electrodes 102 and 104 become permanently electrically connected together. The antifuse structure provides a more reliable device and requires less processing steps than prior art antifuses devices.

The dielectric layer 108 preferably comprises a dielectric material such as silicon dioxide ($SiO_2$) or silicon nitride ($Si_3N_4$). As will be explained below, the preferred thickness of the dielectric layer 108 is determined by the desired fusing voltage of antifuse 100 (i.e., the voltage required to fuse the antifuse 100).

The injector layer 106 provides a source of charge to the injector/dielectric interface to facilitate the antifuse behavior as further explained below. The injector layer 106 preferably comprises a silicon rich dielectric, such as silicon rich nitride (SRN) or silicon rich oxide (SRO), but can comprise other suitable materials that will inject carriers into the dielectric layer 108 at a predetermined yet low electric field intensity. SRN and SRO are two phase materials, with one phase comprising pure silicon, and the other phase comprising silicon nitride ($Si_3N_4$) or silicon dioxide ($SiO_2$). Thus, SRN and SRO comprise silicon nitride ($Si_3N_4$) or silicon dioxide ($SiO_2$) respectively with dispersed silicon throughout. The dispersed silicon is preferably uniformly and controllably dispersed (in three dimensions) throughout the SRN or SRO.

SRN and SRO exhibit unique electrical behavior. In particular, SRN and SRO of appropriately dispersed silicon are very conductive at relatively low field intensities. ($E>10^{-9}$ A/V–cm). Additionally, such material exhibits near ohmic current-voltage characteristics at low field intensities. Additionally, AC capacitance of such a layer is very high, approaching metallic characteristics. When a electric potential is applied across the electrodes 102 and 104, these characteristics cause a smaller fraction of the potential to drop across injector layer 106 and a larger fraction to drop across the dielectric layer 108.

In the preferred embodiment, injector layer 106 and dielectric layer 108 form the transformable insulator that makes up the core of the antifuse 100. When a sufficient voltage is applied across injector layer 106 and dielectric layer 108 (at the electrodes 102 and 104), the antifuse will fuse (ie., the transformable insulator becomes a conductor). After the antifuse 100 has fused, the connection between electrode 102 and electrode 104 becomes a permanent, low resistance connection.

In particular, when a sufficient voltage is applied to the electrodes 102 and 104, the charge is almost instantly distributed across the dispersed silicon in the injector layer 106. The injector layer 106 then provides a source of charge to the injector/dielectric interface and injects this charge into the dielectric layer 108. This instantaneously causes a very high and uniform flux of charges to flow from the injector layer 106 into the dielectric layer 108. This increases the conductivity and lowers the breakdown voltage of the dielectric layer 108 in a very uniform manner. When the breakdown voltage of the dielectric layer 108 is lowered a sufficient amount, the antifuse 100 is fused. Once fused, a minimal voltage applied can cause current to flow through the injector layer 106/dielectric layer 108 composite structure.

The uniform breakdown of the dielectric layer 108 in the preferred embodiment allows antifuse 100 to be designed to predictably and dependably fuse at a predetermined fusing voltage. By selecting the appropriate parameters for the injector layer 106 material and the dielectric layer 108, the fusing voltage of the antifuse 100 can be accurately selected. Furthermore, the antifuse 100 can be designed to have a fusing voltage much lower than prior art antifuse devices allow.

The unique properties of the injector layer 106/dielectric layer 108 core facilitate the antifuse behavior of the preferred embodiment. In particular, the injector layer 106/dielectric layer 108 composite structure exhibits enhanced electron tunneling, at approximately half the electric field required for just the corresponding dielectric layer. For example, in the case of SRO and SRN it is believed that charge transport in the composite injector/dielectric layer takes place by direct tunneling amongst the uniformly distributed silicon islands at the injector/dielectric interface. These silicon islands act as enhanced charge injection centers thereby lowering the energy barrier and enhancing conductance uniformity across the dielectric. This causes uniform and predictable breakdown of the composite at low average field intensity. The preferred embodiment uses this predictable low average field intensity breakdown to facilitate dependable antifuse behavior that fuses at low voltages. In contrast, the antifuse structures in the prior art would typically exhibit a local and geometry sensitive (as well as electrode sensitive) breakdown and is thus unsuitable for creating a reliable and flexible antifuse structure.

One key property of the injector layer 106 is the refractive index of the material. The refractive index of a material is defined as the ratio of speed of an electromagnetic wave in a vacuum to the speed in the material. As such, the refractive index is a measure of the optical density of the material. The refractive index has been widely used to characterize insulators such as oxide and nitride and also to measure the thickness of these materials.

The refractive index of the injector material provides a measure of the physical composition and chemistry of the injector material. In particular, the refractive index is proportional to the amount of silicon particles and how dispersed the silicon particles are in the body of the oxide or nitride. Thus, the refractive index can be used to facilitate control of and develop the two-phase content of SRO and SRN films during fabrication and thereby the unique properties of such films.

Figure 6:
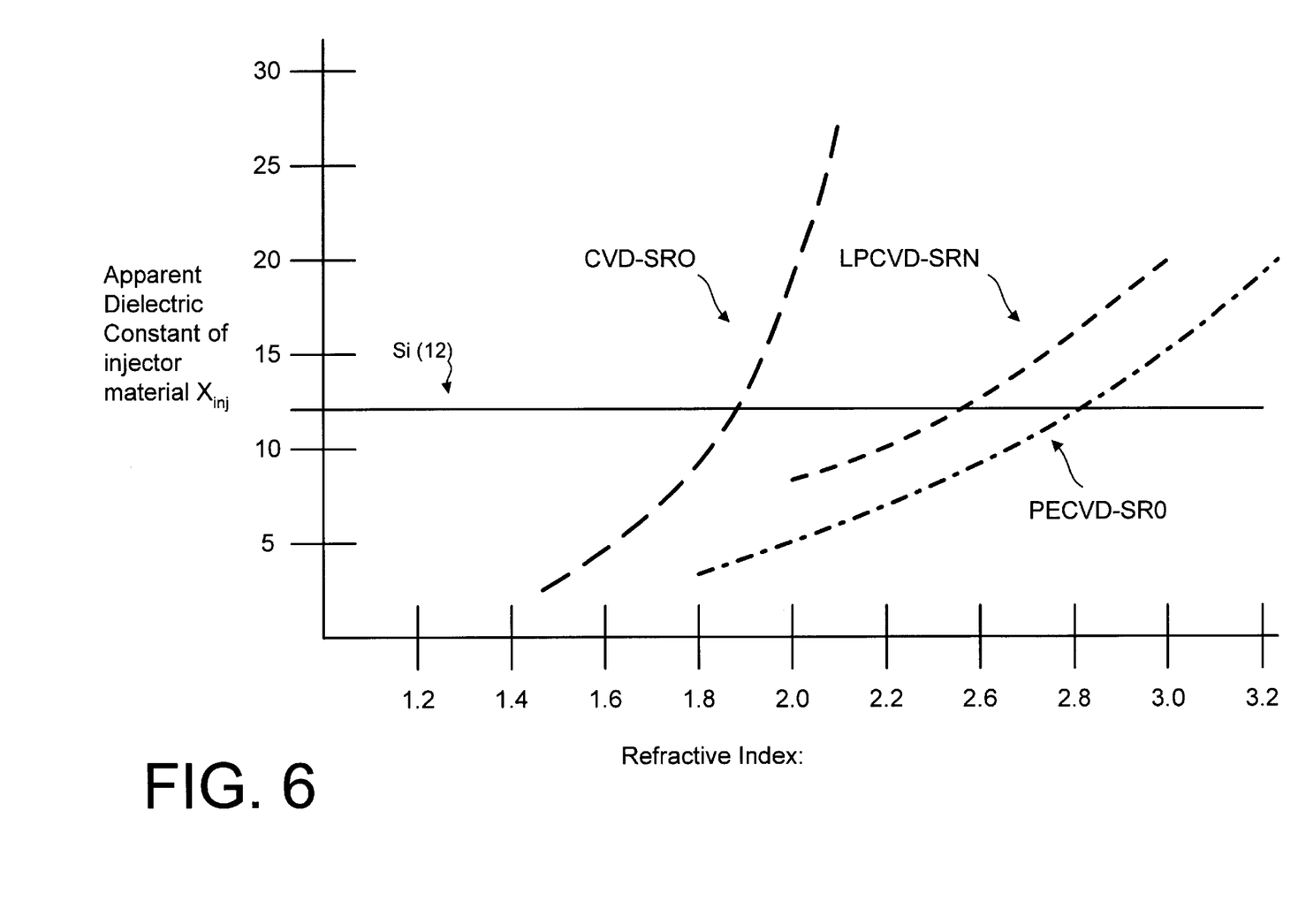
FIG. 6 is a graph plotting the apparent dielectric constant of SRO and SRN as a function of the refractive index.

Turning to FIG. 6, a graph is illustrated plotting the apparent dielectric constant of SRO and SRN films as a function of the refractive index. These characteristics are dependent upon the process used to form the injector layer film. In particular, the graph shows the apparent dielectric constant of SRO formed by chemical vapor deposition (CVD-SRO) and plasma enhanced chemical vapor deposition (PECVD-SRO). Likewise, the SRN is formed using a low pressure chemical vapor deposition (LPCVD-SRN). The refractive index measurements of FIG. 6 are taken using a standard sodium light source having a wavelength of 589.3 nanometers.

Apparent dielectric constant represents the high frequency electrical permitivity of these films. For both SRO and SRN, as the refractive index is increased, the apparent dielectric constant increases. By comparison, the dielectric constant of silicon, a semiconducting material, is a constant of about 12. Likewise, the dielectric constant of silicon dioxide is a constant of about 3.89.

The graph shows that as the refractive index increases, the apparent dielectric constant increases and can be much greater than that of silicon. In particular, when the refractive index of LPCVD-SRN is greater than approximately 2.5, when the refractive index of CVD-SRO is greater than approximately 1.8, and when the refractive index of PECVD-SRO is greater than approximately 2.8, the dielectric constant of each is greater than the dielectric constant of silicon.

The dielectric constant of material is proportional to how much voltage can be supported in the material. The greater the dielectric constant, the less voltage that can be supported. A metal thus has an almost infinite dielectric constant (i.e., almost no voltage can be supported across a metal, instead, the voltage will be uniformly distributed through the metal). Thus, as the refractive index of the injector material layer increases, less and less voltage can be supported, and a lower voltage will be required for charge to travel through the material.

When the SRN or SRO has a sufficient apparent dielectric constant it will function as an injector material for injector layer 106. In the preferred embodiment, the apparent dielectric constant is greater than the dielectric constant of silicon. In the most preferred embodiments, the apparent dielectric constant of the injector layer 106 is 14–25 where the injector layer 106 comprises CVD-SRO, 14–20 where it comprises PECVD-SRO and also 14–20 where it comprises LPCVD-SRN.

Because of the high apparent dielectric, the injector material supports a relatively low voltage across it. Therefore, when an AC or pulsed voltage is imposed between the conductors 102 and 104 of FIG. 1, most of the voltage will be instantaneously dropped across dielectric layer 108. This results in high and uniform charge fluence through the dielectric layer 108, and a corresponding uniform breakdown of the antifuse structure. Additionally, since most of the voltage is dropped across the dielectric layer 108, the breakdown voltage of the antifuse structure could be readily sealed by sealing the dielectric layer thickness alone.

Figure 7:
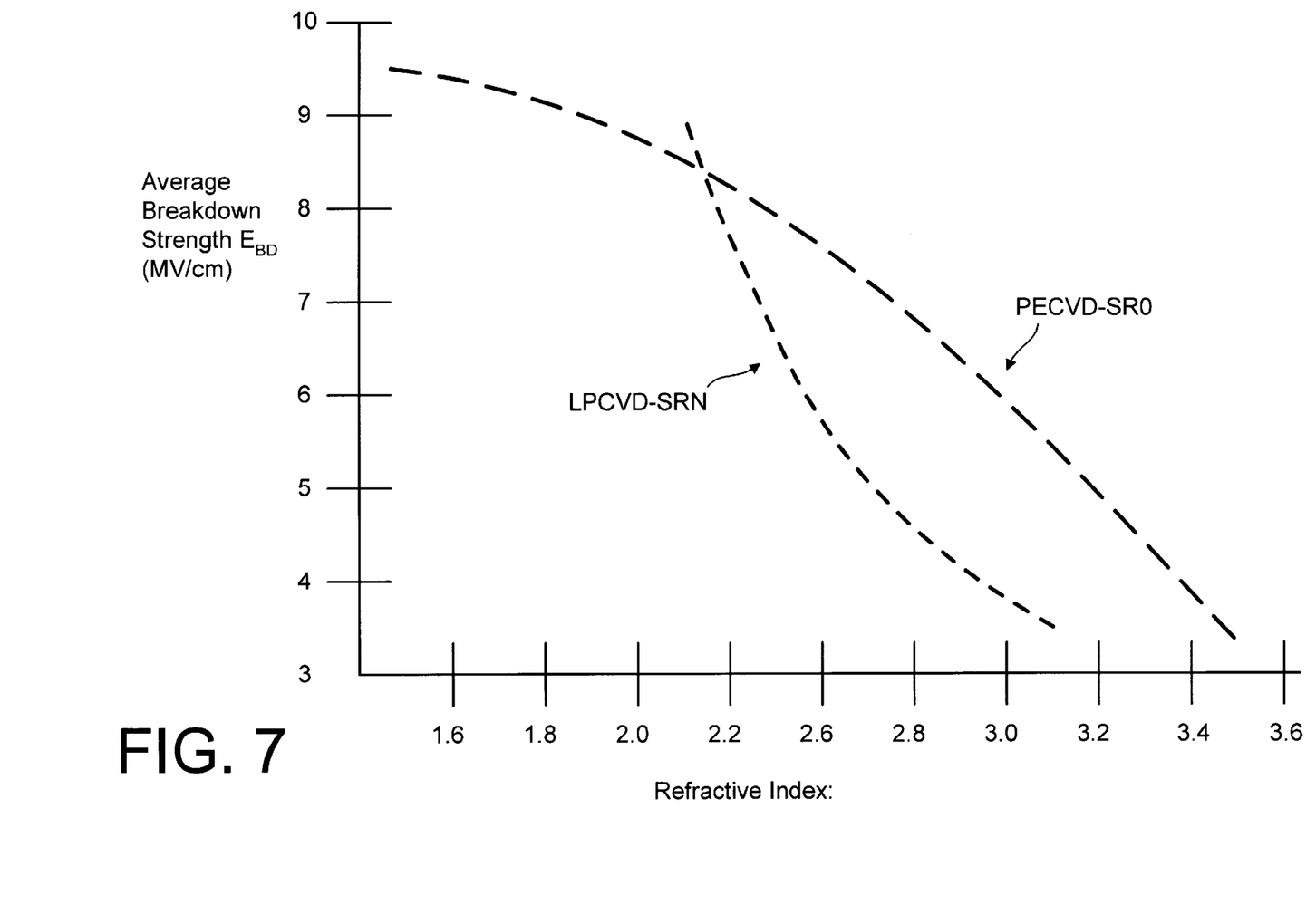
FIG. 7 is a graph of the average breakdown strength as a function of the refractive index for a single injector structure.

Turning to FIG. 7 a graph is shown of the average breakdown strength of the composite injector/dielectric structure versus the refractive index of the injector material. In particular, the graph is for a single injector structure (i.e., an injector layer is formed on only one side of the dielectric layer). The breakdown strength is the amount of voltage, measured in megavolts per cm, that needs to be applied across the composite injector layer/dielectric layer for the dielectric layer to breakdown such that the antifuse fuses together. The graph shows that as the refractive index of the injector material increases, the breakdown strength of the composite structure is decreased. For example, with a refractive index of approximately 2.7 for CVD-SRN or 3.2 for PECVD-SRO, the injector material/dielectric material stack has an average breakdown strength of approximately 5 MV/cm. Likewise, with a refractive index of approximately 2.4 for SRN or 2.85 for SRO, the injector material/dielectric material stack has an average breakdown strength of approximately 6.5 MV/cm.

The desired refractive index of the injector material can be obtained by adjusting the processing condition of the injector film during deposition. For example, to form an PECVD-SRO injector film having a refractive index of 3.2 and an apparent dielectric constant of 2.0, a PECVD process is used to form the SRO injector layer using reactants silane ($SiH_4$) and nitrous oxide ($N_2O$) in a 1:1 flow ratio; in an argon (Ar) background gas; at a 350° C. temperature; at a 0.6 Torr pressure; with an RF power of 12.5 watts at 13.56 MHz; followed by a rapid thermal anneal (optional). Because this process is a low temperature process, it is preferably for back end of line (BEOL) processing where the temperatures are kept lower to avoid melting typical interconnection materials such as aluminum.

As another example, to form an SRN injector film having a refractive index of 2.7 and an apparent dielectric constant of 14.2, a LPCVD process is used to form the SRN injector layer using reactants dichlorosilane ($SiH_2Cl_2$) and ammonia ($NH_3$) in a 20:1 flow ratio; in a nitrogen ($N_2$) background gas; at a 770° C. temperature; at a 0.25 Torr pressure; with a 110 SCCM flow; and a 17 Å/min deposition rate followed by an anneal at 1000° C. for 30 minutes. Because this process requires a high temperature, it is preferable only for Front End of Line (FEOL) processing, where low melting point materials such as aluminum are not present in the device.

As another example, to form an SRO injector film having a refractive index of 2.0 and an apparent dielectric constant of 18, a high temperature CVD process is used to form the SRO injector layer using reactants nitrous oxide ($N_2O$) and silane ($SiH_4$) in a 3:1 flow ratio; in a nitrogen background gas; at a 700° C. temperature at a 1 ATM pressure; followed by an anneal at 1000° C. in $N_2$ for 30 minutes.

For further information on such processes see A. Bhattacharyya et al., Physical and Electrical Characteristics of LPCVD Silicon Rich Nitride, The Electrochemical Society, Volume 84-2, Oct. 11, 1984 for SRN processes; D. J. Dimaria et al., A study of the electrical and luminescence characteristics of a novel Si-based thin film electroluminescent device, J. Appl. Phys. 54(8) August, 1983 for SRO processes; and D. J. Dimaria and D. W. Dong, High Current Injection into $SiO_2$ from silicon rich $SiO_2$ and Experimental Applications, J. Appl. Phys. 51(5) May, 1980.

The fusing voltage of a particular antifuse in accordance with the preferred embodiment is determined by the dielectric layer 108 thickness, the injector layer 106 thickness and the injector material refractive index. As shown in FIGS. 6 and 7, adjusting the injector material refractive index adjusts the apparent dielectric constant and the average breakdown strength. The fusing voltage $V_{FV}$ for a particular injector/dielectric composition is given by equation 1:

$$V_{FV} = E_{BD}\left(\frac{X_{OX}}{X_{INJ}} d_{INJ} + d_{OX}\right) \quad (1)$$

where $E_{BD}$ is the average breakdown strength of the composite injector and dielectric material of the antifuse structure (FIG. 7); where $d_{INJ}$ is the injector layer thickness;

where $d_{OX}$ is the dielectric layer thickness; where $X_{OX}$ is the dielectric constant for the dielectric layer material (e.g., 3.78 for $SiO_2$ or 8.9 for $Si_3N_4$); and where $X_{INJ}$ is the apparent dielectric constant of the injector material (FIG. 6).

Thus, the fusing voltage can be lowered by decreasing the dielectric layer 108 thickness ($d_{OX}$) or by increasing the refractive index of the injector material which increases the injector material apparent dielectric constant ($X_{INJ}$) (see FIG. 6) and decreases the average breakdown strength of the composite material ($E_{BD}$) (see FIG. 7).

In designing an antifuse, it is generally preferable for process simplicity and control that the injector material refractive index and injector layer 106 thickness be kept constant. However, in some circumstances a particular application may require a change in the injector layer in order to achieve a specific fusing voltage.

Thus, by selecting an appropriate dielectric layer 108 thickness and an injector layer 106 with an appropriate refractive index an antifuse can be formed with a specific fusing voltage. For example, to form an antifuse with a fusing voltage of 10 volts, 100 Å of $SiO_2$ dielectric material is paired with a 375 Å SRO injector layer having approximately a 3.2 refractive index. Likewise, the same fusing voltage can be obtained with 100 Å of $SiO_2$ paired with a 375 Å SRN injector having 2.7 refractive index.

To form an antifuse with a fusing voltage of 5 volts, 60 Å of $SiO_2$ is paired with a 150 Å PECVD-SRO injector layer having approximately a 3.2 refractive index. Likewise, the same fusing voltage can be obtained with 50 Å of $SiO_2$ paired with 150 Å LPCVD-SRN injector layer having a 2.7 refractive index.

Thus, by adjusting the dielectric layer thickness and the refractive index of the injector layer, the preferred embodiment antifuse can be scaled as device sizes and operating voltages decrease. In most applications, the fusing voltage is preferably twice the power-supply voltage of the device. This allows the fusing to be done at a relatively low voltage, but the possibility of unwanted fusing during operation is prevented. Thus, as technology advances and power supply voltages decrease, the preferred embodiment can be easily scaled. Conversely, prior art antifuses do not allow such scaling to low fusing voltages.

Figure 2:
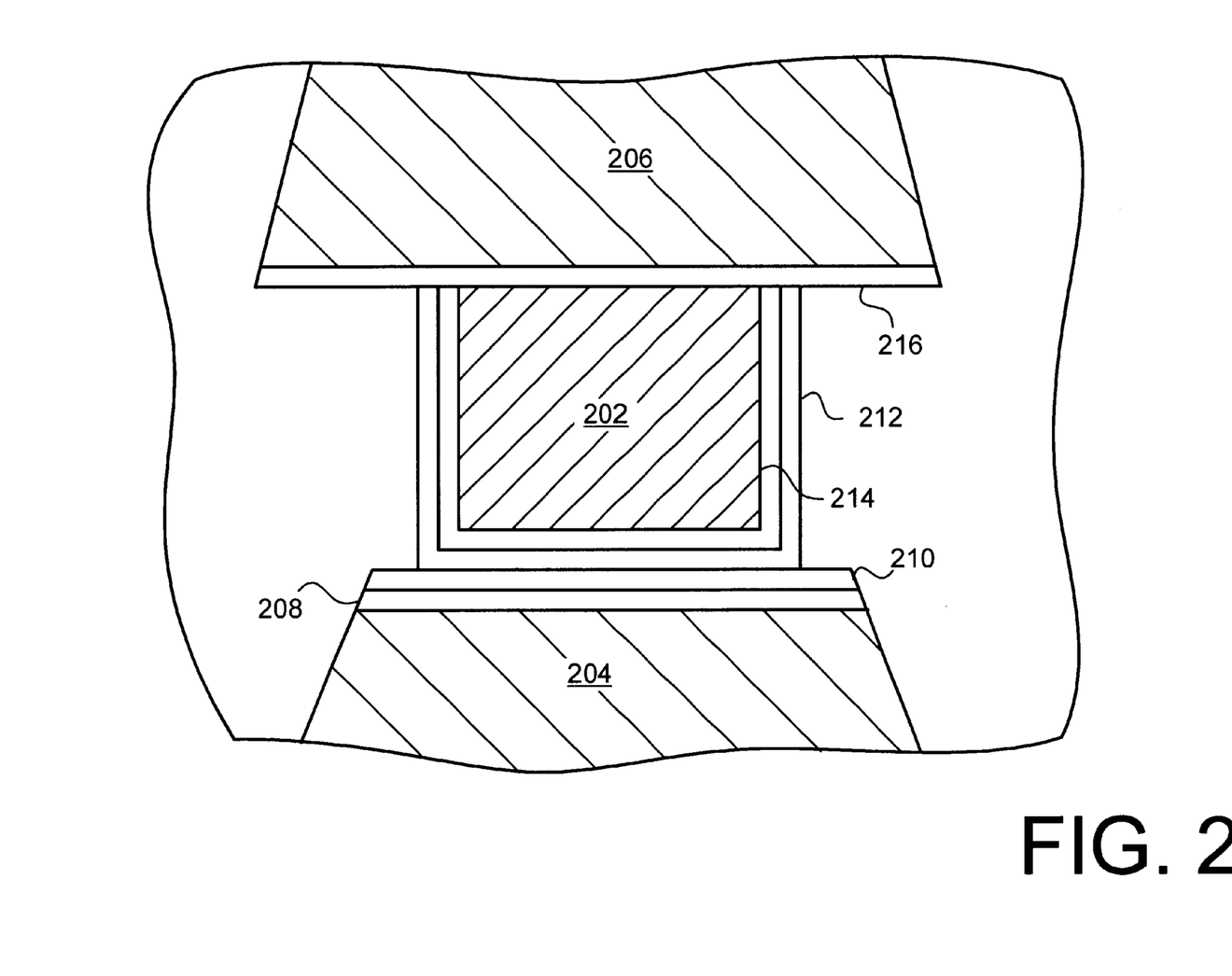
FIG. 2 is a cross-sectional side view of a standard interconnect stud.

The antifuse of the preferred embodiment can be integrated into tungsten stud technology as part of a back end of line (BEOL) processing scheme. Tungsten studs are one example of an interconnect technology commonly used to connect connection lines, such as metal layer 1 to metal layer 2. Turning briefly to FIG. 2, an ordinary tungsten stud interconnect scheme is illustrated. A tungsten stud 202 is used to connect a first metal layer 204 to a second metal layer 206. The first metal layer 204 includes an titanium (Ti) layer 208 and a titanium nitride (TiN) layer 210. The tungsten stud is formed in a via with a titanium layer 212 and a titanium nitride layer 214. The second metal layer 204 includes a titanium layer 216 on its underside.

Figure 3:
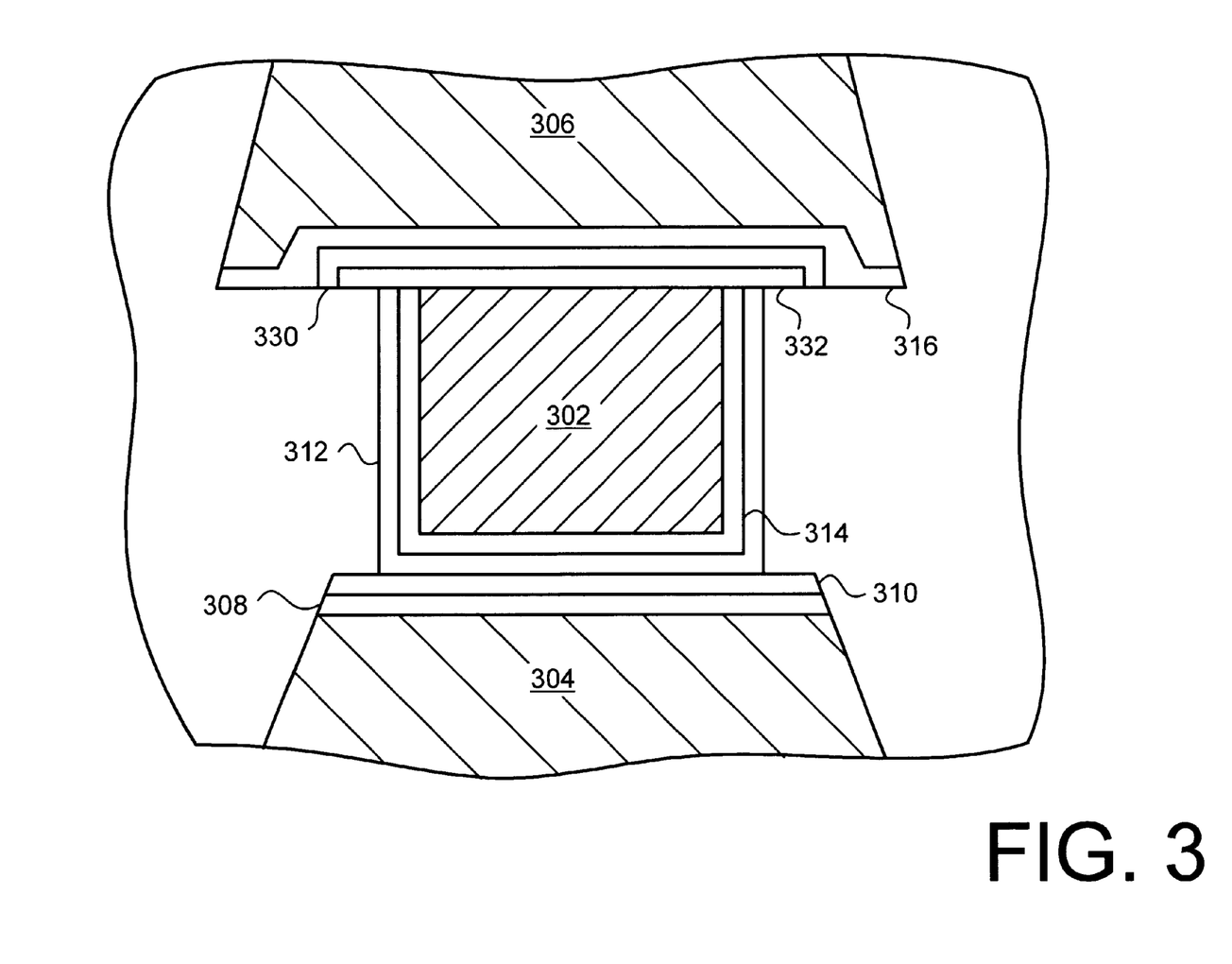
FIG. 3 is a cross-sectional side view of an antifuse structure in accordance with the preferred embodiment integrated into an interconnect stud.

Turning to FIG. 3, a tungsten stud interconnect scheme has been modified according to the preferred embodiment such that the connection between tungsten stud 302, first metal layer 304 and second metal layer 306 can selectably be made by applying a voltage sufficient to fuse the antifuse. In this embodiment dielectric layer 330 and an injector layer 332 has been formed between the tungsten stud 302 and the second metal layer 306. In this way, the two metal layers 304 and 306 are not electrically connected when fabricated, but can be connected by applying a voltage sufficient to fuse the antifuse.

Again, the dielectric layer 330 preferably comprises a dielectric material such as silicon dioxide ($SiO_2$) or silicon nitride ($Si_3N_4$). Likewise, the injector layer 332 preferably comprises silicon rich nitride (SRN) or silicon rich oxide (SRO). The thickness of the dielectric layer and injector layer will depend upon the desired fusing voltage.

Fabricating the antifuse illustrated in FIG. 3 involves first depositing and patterning the first metal layer 304 (typically AlCu with a titanium and a titanium nitride layer above it). Insulator material is then deposited over the first metal layer and via is formed in the insulator material in which the tungsten stud will be formed. A liner, typically titanium and titanium nitride is then deposited in the via followed by a tungsten deposition. The top surface is planarized with a chemical mechanical polish (CMP). This finishes the formation of tungsten interconnect stud 302 with a titanium layer 312 and a titanium nitride layer 314.

The previous steps are all part of a typical process used to form interconnect studs. Thus, at this point there is no difference in the processing required or the resulting structure for an interconnect to be used as an antifuse according to the preferred embodiment and standard interconnects.

The next step is to deposit the injector layer 330. This is done, for example, by performing a low temperature plasma deposition of silicon rich nitride. For example, using a 0.30/1 flow rate of $SiH_4/NH_3$, with a Si/N ratio of approximately 1.5/1 creates a SRN layer having a refractive index of 3.0+/−0.3.

The SRN layer is then subjected to a rapid thermal anneal (RTA) under a $N_2$ ambient to form the two phase SRN micro structure. A mask is then formed over the antifuse regions, and the SRN is etched away everywhere the mask is not. Thus, on those interconnects that are to be used as antifuses the mask is formed above to protect the SRN while the SRN layers over the interconnects to be used as standard interconnects is removed.

The dielectric layer 330 is then formed above the SRN. This can be done in several ways. For example, subjecting the SRN layer to a RTA in an $O_2$ ambient converts the exposed portions of SRN to a layer of $SiO_2$. In the alternative, the dielectric layer is formed by an RTA in an $O_2$ ambient followed by a thin TEOS (tetraethyl oxysilicate) process.

Following the formation of the dielectric layer 330, the second metal layer 306 is formed above the antifuse. In the illustrated example, the second metal layer 306 includes a titanium layer 316 underneath.

Thus, the preferred embodiment can be easily be integrated into a tungsten stud interconnect scheme without requiring excessive processing steps and fabrications. Additionally, the flexibility of the preferred embodiment is such that the antifuse can be fabricated and used without requiring special or different electrode materials (i.e., the tungsten stud, titanium, titanium nitride and such of ordinary interconnect schemes can still be used).

Figure 4:
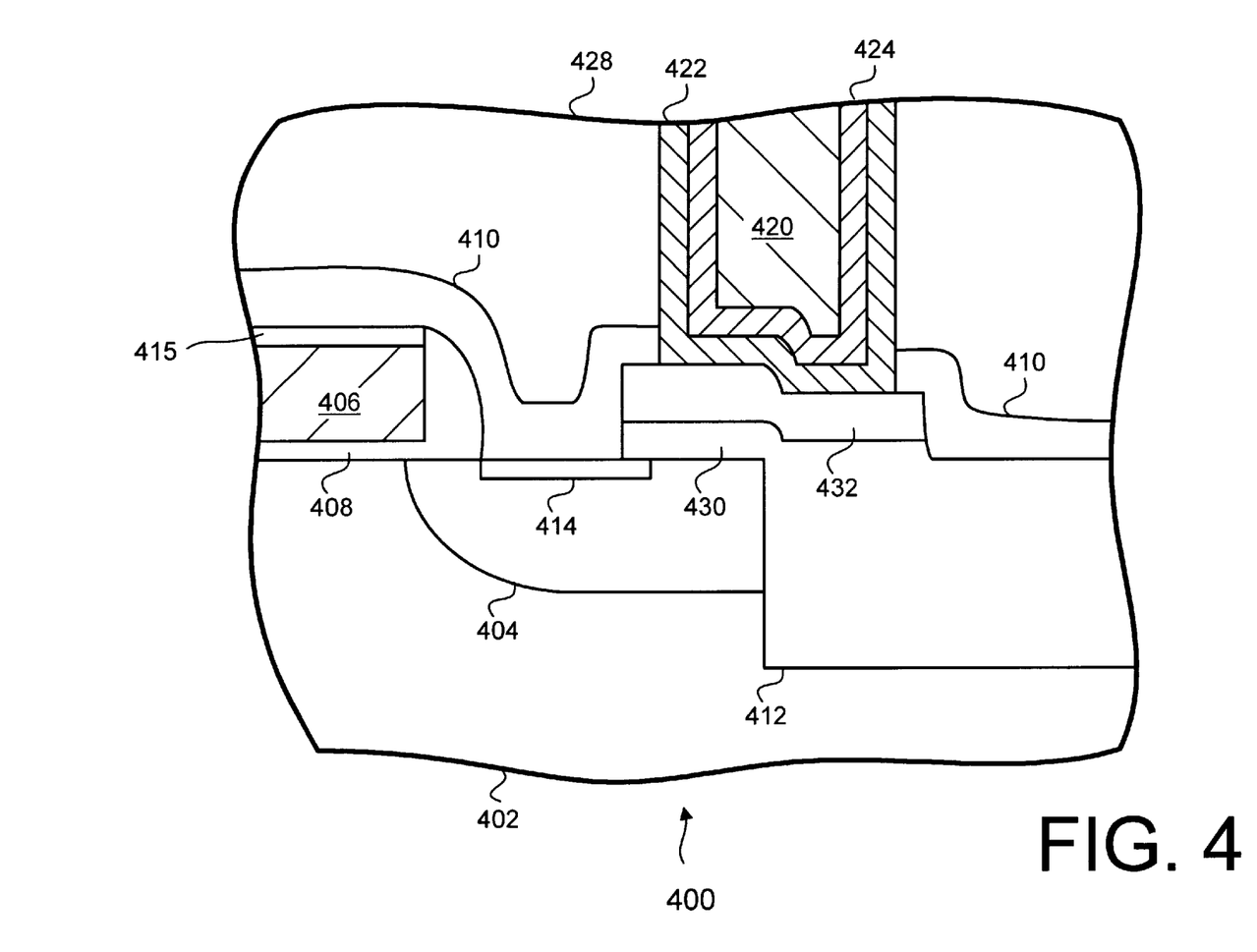
FIG. 4 is a cross-sectional side view of an antifuse structure in accordance with the preferred embodiment integrated between a local interconnect and a FET.

The flexibility of the preferred embodiment allows it also to be applied to devices in front-end-of-line processing. This allows devices, such as programable read only memories (PROMs) to be fabricated without significant changes to the fabrication process. Turning to FIG. 4, a device portion 400 containing an antifuse prom in accordance with the preferred embodiment is schematically illustrated. The device portion 400 is fabricated into a silicon substrate 402, and includes a portion of a field effect transistor (FET) that includes a diffusion region 404, a gate 406, and a gate dielectric 408. Adjacent to the diffusion region is a dielectric isolation region 412. A dielectric cap 410 overlays the gate 406 and the dielectric isolation region 412. An additional layer of silicide 415 is formed over gate 406 and simultaneously a layer of silicide 414 is formed over the exposed region of diffusion 404 prior to the deposition of the dielectric cap 410. The silicide 414 and 415 lowers the series resistance of gate 406 and diffusion 404.

The diffusion region 404 can suitably comprise an N+ or P+ type diffusion. The gate 406 can comprise a suitable metal or polysilicon. The gate dielectric 408 preferably comprises silicon dioxide ($SiO_2$) but can comprise silicon nitride ($Si3N_4$), nitrided oxide, a composite of silicon dioxide and silicon nitride, or any other suitable dielectric. The dielectric cap 410 preferably comprises silicon nitride ($Si_3N_4$) but can suitably comprise other suitable dielectric. The dielectric isolation region 412 preferably comprises silicon dioxide ($SiO_2$) but can comprise any other suitable structure for device isolation.

The device portion 400 also includes a local interconnect, the local interconnect including a core 420 (suitably tungsten(W) or molybdenum (Mo)), a titanium (Ti) liner 422 and a titanium nitride (TiN) liner 424.

The device portion 400 also includes an antifuse structure that is able to selectively connect the local interconnect with the diffusion region 404 of the FET. In particular, an injector layer 432 and a dielectric layer 430 are fabricated between the local interconnect and the diffusion region 404. Again, dielectric layer 430 preferably comprises a dielectric material such as silicon dioxide ($SiO_2$) or silicon nitride ($Si_3N_4$) with a the preferred thickness of the dielectric layer 430 determined by the desired voltage required to fuse the antifuse. In the illustrated example, the dielectric layer 430 is formed as an appendage from dielectric isolation region 412, but could suitably be formed separately as well. In this embodiment, the dielectric layer 430 and the injector layer 432 are formed and patterned earlier followed by the formation of silicide 414 and 415, cap dielectric 410 and the associated passivation glass 428.

The injector layer 432 preferably comprises silicon rich nitride (SRN) or silicon rich oxide (SRO). The thickness of the injector layer 432 is also dependent upon the desired fusing voltage.

With the injector layer 432 and dielectric layer 430 so formed an antifuse results. A connection can be established between the local interconnect and the FET by supplying a sufficient voltage across the antifuse. As described earlier, the voltage causes the antifuse to fuse, causing a permanent connection to be established.

Figure 5:
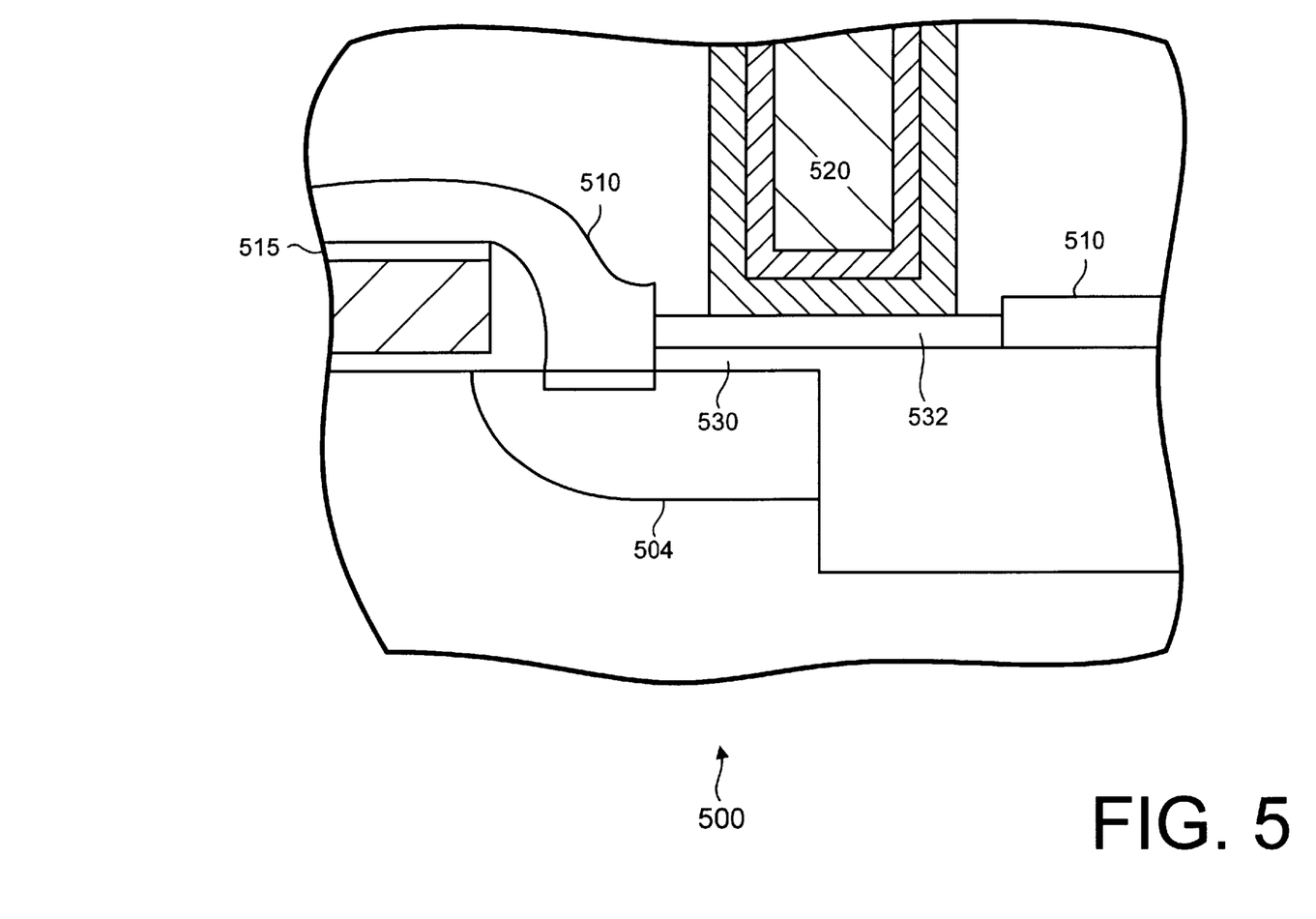
FIG. 5 is a cross-sectional side view of an antifuse structure in accordance with the preferred embodiment integrated between a local interconnect and a FET.

Turning to FIG. 5, a second example of the preferred embodiment antifuse being integrated into FOEL processing is illustrated in device portion 500. In this example the antifuse again comprises an injector layer 532 and a dielectric layer 530. Again, in this case the antifuse can be used to established between a FET and a local interconnect. In this example, the silicide layer 515 and the dielectric cap 510 are formed earlier and patterned to define the antifuse region. Subsequently, the dielectric layer 530 and the injector layer 532 are formed over the "antifuse" region where the dielectric cap layer 510 is removed. This embodiment yields a planer antifuse structure between interconnect 520 and diffusion 504, enhancing yield and reliability of the antifuse device thus fabricated.

It should be noted that the flexibility of the preferred embodiment antifuse allows it to formed in many different ways in FOEL process, and can be used to connect any type of devices in addition to the illustrated local interconnect/ FET and can be used in almost any technology type. Thus, the illustrated examples in FIGS. 4 and 5 should not be construed as limiting the antifuse of the preferred embodiment to these particular FOEL structures.

Thus, the preferred embodiment provides an antifuse that can be used in a wide variety of applications. The preferred embodiment has the further advantage of being able to be scaled to smaller dimensions and to operate with lower fusing voltages than the prior art.

While the invention has been particularly shown and described with reference to preferred exemplary embodiments thereof, it will be understood by those skilled in the art that variations in form and detail may be made therein without departing from the spirit and scope of the invention. For example, additionally injector layers and/or dielectric layers can be combined to form a multiple layered antifuses.

What is claimed is:

1. A method for forming an antifuse, said method comprising the steps of:

a) forming an injector layer; and b) forming a dielectric layer adjacent said injector layer, wherein the injector layer and the dielectric layer are formed between a pair of electrodes, said injector layer injecting charge into said dielectric layer when a voltage bias is applied to said pair of electrodes, said injecting charge permanently changing the conductivity characteristics of said dielectric layer such that said dielectric layer is substantially conductive.

2. The method of claim 1 wherein said step of forming an injector layer comprises forming silicon rich oxide.

3. The method of claim 2 wherein the step of forming silicon rich oxide comprises a chemical vapor deposition of said silicon rich oxide.

4. The method of claim 2 wherein the step of forming silicon rich oxide comprises a plasma enhanced chemical vapor deposition of said silicon rich oxide.

5. The method of claim 2 wherein the silicon rich oxide has an apparent dielectric constant of greater than 12.

6. The method of claim 2 wherein the silicon rich oxide has an apparent dielectric constant between 14 and 25.

7. The method of claim 1 wherein said step of forming an injector layer comprises forming silicon rich nitride.

8. The method of claim 7 wherein said step of forming silicon rich nitride comprises a low pressure chemical vapor deposition of said silicon rich nitride.

9. The method of claim 7 wherein the silicon rich nitride has an apparent dielectric constant of greater than 12.

10. The method of claim 7 wherein the silicon rich nitride has an apparent dielectric constant between 14 and 20.

11. The method of claim 1 wherein the step of forming a dielectric layer comprises forming silicon dioxide.

12. The method of claim 1 wherein the step of forming a dielectric layer comprises forming silicon nitride.

13. The method of claim 1 further comprising the step of forming a first electrode and a second electrode, wherein said injector layer and said dielectric layer are interposed between and electrically coupled to said first electrode and said second electrode.

14. A method for forming an antifuse comprising the steps of:

a) forming a first electrode;

b) forming a dielectric layer adjacent said first electrode;

c) forming an injector layer adjacent said dielectric layer;

d) forming a second electrode adjacent said injector layer, wherein said injector layer injects charge into said dielectric layer when a voltage is applied between said first electrode and said second electrode, said injected charge permanently changing the conductivity characteristics of said dielectric layer such that said dielectric layer becomes substantially conductive.

15. The method of claim 14 wherein the step of forming an injector layer comprises forming silicon rich oxide.

16. The method of claim 15 wherein the step of forming silicon rich oxide comprises chemical vapor deposition of said silicon rich oxide.

17. The method of claim 15 wherein the step of forming silicon rich oxide comprises a plasma enhanced chemical vapor deposition of said silicon rich oxide.

18. The method of claim 15 wherein the step of forming silicon rich oxide comprises forming silicon rich oxide having an apparent dielectric constant of greater than 12.

19. The method of claim 15 wherein the step of forming silicon rich oxide comprises forming silicon rich oxide having an apparent dielectric constant of between 14 and 25.

20. The method of claim 14 wherein the step of forming an injector layer comprises forming silicon rich nitride.

21. The method of claim 20 wherein the step of forming silicon rich nitride comprises low pressure chemical vapor depostion of said silicon rich nitride.

22. The method of claim 20 wherein the step of forming silicon rich nitride comprises forming silicon rich nitride having an apparent dielectric constant of greater than 12.

23. The method of claim 20 wherein the step of forming silicon rich nitride comprises forming silicon rich nitride having an apparent dielectric constant of between 14 and 20.

24. The method of claim 14 wherein the step of forming a first electrode comprises forming an interconnect stud and wherein the step of forming a second electrode comprises forming a first interconnect wire.

25. The method of claim 14 wherein the step of forming a first electrode comprises forming diffusion region in a substrate.

26. The method of claim 14 wherein the step of forming a first electrode comprises forming diffusion region in a silicon substrate and wherein the step of forming a second electrode comprises forming an interconnect stud.

* * * * *

UNITED STATES PATENT AND TRADEMARK OFFICE
CERTIFICATE OF CORRECTION

PATENT NO. : 6,344,373 B1                                                        Page 1 of 1
DATED : February 5, 2002
INVENTOR(S) : Bhattacharyya et al.

It is certified that error appears in the above-identified patent and that said Letters Patent is hereby corrected as shown below:

<u>Title page,</u>
The title "ANTIFUSE STRUCTURE AND PROCESS" should read as follows:
-- A METHOD FOR FORMING AN ANTIFUSE --

Signed and Sealed this

Twenty-third Day of April, 2002

*Attest:*

*Attesting Officer*
                                      JAMES E. ROGAN
                        *Director of the United States Patent and Trademark Office*